(12) United States Patent
Kanada et al.

(10) Patent No.: US 11,757,141 B2
(45) Date of Patent: Sep. 12, 2023

(54) DIAGNOSTIC DEVICE FOR SECONDARY BATTERY AND RECOVERY METHOD FOR SECONDARY BATTERY

(71) Applicant: TOYOTA JIDOSHA KABUSHIKI KAISHA, Toyota (JP)

(72) Inventors: Ryo Kanada, Toyota (JP); Kenji Takahashi, Toyota (JP); Mai Fujiwara, Handa (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 134 days.

(21) Appl. No.: 17/138,077

(22) Filed: Dec. 30, 2020

(65) Prior Publication Data

US 2021/0226270 A1 Jul. 22, 2021

(30) Foreign Application Priority Data

Jan. 17, 2020 (JP) .................................. 2020-005875

(51) Int. Cl.

| | |
|---|---|
| *H01M 14/00* | (2006.01) |
| *H01M 10/48* | (2006.01) |
| *H01M 10/0525* | (2010.01) |
| *H01M 4/133* | (2010.01) |
| *G01R 31/382* | (2019.01) |
| *H01M 10/0587* | (2010.01) |

(Continued)

(52) U.S. Cl.
CPC .......... *H01M 10/48* (2013.01); *G01R 31/382* (2019.01); *H01M 4/133* (2013.01); *H01M 4/134* (2013.01); *H01M 10/0525* (2013.01); *H01M 10/0587* (2013.01); *H01M 10/44* (2013.01)

(58) Field of Classification Search
CPC ............ H01M 10/48; H01M 10/0525; H01M 10/052; H01M 10/0587; H01M 10/44; H01M 4/133; H01M 4/134; G01R 31/382; G01R 31/36
See application file for complete search history.

(56) References Cited

FOREIGN PATENT DOCUMENTS

| | | | |
|---|---|---|---|
| JP | 5765258 B2 | 1/2015 | |
| JP | 5765258 B2 | 8/2015 | |
| JP | 2017009422 | * 1/2017 | ............. G01R 31/36 |

OTHER PUBLICATIONS

Office Action dated Apr. 19, 2023 issued in U.S. Appl. No. 17/897,912.

* cited by examiner

*Primary Examiner* — Raymond Alejandro
(74) *Attorney, Agent, or Firm* — Sughrue Mion, PLLC

(57) ABSTRACT

A diagnostic device for a secondary battery having a structure in which positive electrodes and negative electrodes are alternately arranged includes an electronic control unit. The electronic control unit is configured to acquire a first resistance value indicating a magnitude of electrical resistance of the secondary battery, compress at least a part of the secondary battery, acquire a second resistance value indicating a magnitude of electrical resistance of the secondary battery after the compression, determine, using the first and second resistance values, whether an amount of decrease in electrical resistance of the secondary battery by the compression is greater than a predetermined value, and determine whether an increase in resistance due to distortion of at least one of the positive electrodes and the negative electrodes occurs in the secondary battery using a result of the determination.

4 Claims, 11 Drawing Sheets

(51) Int. Cl.
*H01M 10/44* (2006.01)
*H01M 4/134* (2010.01)

DIAGNOSTIC DEVICE FOR SECONDARY BATTERY AND RECOVERY METHOD FOR SECONDARY BATTERY

CROSS-REFERENCE TO RELATED APPLICATION

This application claims priority to Japanese Patent Application No. 2020-005875 filed on Jan. 17, 2020, incorporated herein by reference in its entirety.

BACKGROUND

1. Technical Field

The present disclosure relates to a diagnostic device and a recovery method for a secondary battery.

2. Description of Related Art

Japanese Patent No. 5765258 (JP 5765258 B) discloses a technology in which a capacity (hereinafter, also referred to as a "battery capacity") of a secondary battery having a multilayer electrode structure is acquired, and a constraint force on the secondary battery is adjusted according to a degree of a decrease in the battery capacity. The technology is focused on the fact that when a positive electrode active material layer of a positive electrode plate of a lithium-ion secondary battery is cracked, the degree of a decrease in the battery capacity is greater than before the crack occurs. JP 5765258 B discloses that, when such a crack occurs, by compressing the lithium-ion secondary battery more tightly than before the crack occurs, a gap between the crack portions becomes smaller and the battery capacity is slightly increased. The multilayer electrode structure is a structure in which positive electrodes and negative electrodes are alternately arranged, and includes both a wound body and a multilayer flat plate.

SUMMARY

In the technology described in JP 5765258 B, deterioration of the performance of the secondary battery is not detected until the active material layer is cracked. Once the active material layer is cracked, it is difficult to recover it. In addition, when the battery capacity is decreased due to another factor, it is not increased even if the constraint force on the secondary battery is increased.

The present disclosure provides a technology that accurately determines whether deterioration of recoverable performance of a secondary battery, more specifically, an increase in resistance of the secondary battery having a multilayer electrode structure due to distortion of an electrode, occurs, and executes a recovery process on the secondary battery, as needed.

A first aspect of the present disclosure is a diagnostic device for a secondary battery having a structure in which positive electrodes and negative electrodes are alternately arranged. The diagnostic device includes an electronic control unit. The electronic control unit is configured to acquire a first resistance value indicating a magnitude of electrical resistance of the secondary battery before compression and compress at least a part of the secondary battery. The electronic control unit is configured to acquire a second resistance value indicating a magnitude of electrical resistance of the secondary battery after the compression. The electronic control unit is configured to determine, using the first resistance value and the second resistance value, whether an amount of decrease in electrical resistance of the secondary battery by the compression is greater than a predetermined value. The electronic control unit is configured to determine whether an increase in electrical resistance due to distortion of at least one of the positive electrodes and the negative electrodes occurs in the secondary battery using a result of the determination on the amount of decrease in electrical resistance.

In the secondary battery having a multilayer electrode structure (that is, a structure in which positive electrodes and negative electrodes are alternately arranged), a gap may be created between the layers when an electrode composing the multilayer structure is distorted (for example, bent). In the secondary battery having the multilayer electrode structure, such a gap may act so as to increase a distance between the electrodes or decrease a contact point (or a contact area) of an electrode active material. Accordingly, when the distance between the electrodes is increased or the contact point (or the contact area) of the electrode active material is decreased, electrical resistance of the secondary battery tends to be increased due to a contact failure.

The increase in resistance of the secondary battery due to such distortion of the electrode is temporarily resolved by compressing the secondary battery. In other words, the electrode becomes close to its original form due to the compression. As distortion of the electrode is decreased, electrical resistance of the secondary battery is decreased.

In the diagnostic device for the secondary battery, an information acquisition unit compresses at least the part of the secondary battery and a first determination unit determines whether the amount of decrease in electrical resistance of the secondary battery by the compression is greater than the predetermined value. The information acquisition unit may compress the entire secondary battery, or may selectively compress only a part where distortion easily occurs or only a part where contact resistance due to distortion is easily increased. As such, when the increase in resistance of the secondary battery due to distortion of the electrode occurs, electrical resistance of the secondary battery is decreased by compressing the distorted part. Therefore, it is possible to accurately determine whether the increase in resistance due to distortion of the electrode occurs in the secondary battery, using the result of the determination by the first determination unit.

The secondary battery to be diagnosed may be a single battery, a module including a plurality of single batteries, or an assembled battery composed of the plurality of single batteries (cells) that is electrically connected to one another.

In the diagnostic device, upon determining that the increase in electrical resistance due to distortion of at least one of the positive electrodes and the negative electrodes occurs in the secondary battery, the electronic control unit may be configured to execute a predetermined recovery process. The predetermined recovery process may include charging, while a load that compresses the secondary battery is applied to the secondary battery, the secondary battery in a discharged state in which a state-of-charge (SOC) of the secondary battery has become equal to or less than a predetermined SOC value.

In the diagnostic device, when the electrode composing the multilayer structure is distorted, distortion of the electrode is easily resolved by executing the predetermined recovery process. When the electrode shifts from a low energy state (that is, a low SOC) to a high energy state (that is, a high SOC), the electrode receives a compression force applied by the load and easily returns to its original form. In addition, as a voltage is applied between the electrodes and a current flows, a state of interface between the electrodes is easily stabilized.

The state-of-charge (SOC) indicates a remaining power storage amount. For example, a ratio of a current power storage amount to a power storage amount of a fully charged state is represented by 0% to 100%. As a SOC measuring method, a well-known method, such as a current integration method or an open circuit voltage (OCV) estimation method, can be adopted.

The compression force in the predetermined recovery process may be stronger than the compression force applied by the information acquisition unit. As the compression force in the predetermined recovery process is increased, the electrode tends to return to its original form more easily. On the other hand, since the compression by the information acquisition unit is executed when it is not clear whether distortion of the electrode occurs, it is desirable that the compression force should be weaker than the compression force in the predetermined recovery process such that a normal electrode (that is, an electrode in which distortion does not occur) is not damaged.

The load in the predetermined recovery process may be fixed or variable. As the load is increased, distortion of the electrode is resolved more easily. Then, as distortion of the electrode is resolved, electrical resistance of the secondary battery is decreased. However, when the load exceeds a limit value (hereinafter, also referred to as a "saturation load"), electrical resistance of the secondary battery is not decreased even if the load is increased. The load in the predetermined recovery process may be a saturation load which is obtained in advance by experiments or simulation.

In the diagnostic device, the predetermined recovery process may include repeating, while the load that compresses the secondary battery is applied to the secondary battery, discharging the secondary battery such that the SOC of the secondary battery becomes equal to or less than the predetermined SOC value and charging the secondary battery in the discharged state in which the SOC of the secondary battery has become equal to or less than the predetermined SOC value, until electrical resistance of the secondary battery becomes equal to or less than a predetermined value.

As such, by repeating the discharging and the charging, electrical resistance of the secondary battery is sufficiently and easily decreased.

In the diagnostic device, the electronic control unit may be configured to compress the secondary battery by applying a load from the outside of the secondary battery.

With the above configuration, the secondary battery can be appropriately compressed and the compression force can be adjusted according to the magnitude of the load.

In the diagnostic device, the electronic control unit may be configured to compress the positive electrodes of the secondary battery by expanding the negative electrodes of the secondary battery.

The negative electrodes and the positive electrodes may have different distortion susceptibility depending on the secondary battery. For example, when a secondary battery in which negative electrodes that are expanded during the charging and contracted during the discharging is adopted is used (that is, the charging and the discharging are repeated), distortion (more specifically, deformation causing a gap between the electrodes) of a positive electrode easily occurs. With the diagnostic device, it is possible to easily determine whether an increase in resistance due to distortion of the positive electrode occurs in the secondary battery. In the diagnostic device, the information acquisition unit can compress the positive electrodes by expanding the negative electrodes, and a second determination unit can determine whether the increase in resistance due to distortion of the positive electrode occurs in the secondary battery.

A second aspect of the present disclosure is a recovery method for a secondary battery having a structure in which positive electrodes and negative electrodes are laminated. The recovery method includes a first compression for compressing at least a part of the secondary battery, a second compression for compressing the secondary battery by applying a load from the outside of the secondary battery when an amount of decrease in electrical resistance of the secondary battery by the first compression is greater than a predetermined value, and a recovery for charging the secondary battery in a discharged state in which a SOC of the secondary battery has become equal to or less than a predetermined SOC value while the secondary battery is compressed by the second compression.

With the recovery method, when distortion of an electrode composing a multilayer structure occurs, the recovery process is executed, such that distortion of the electrode is easily resolved.

Each of the first compression and the second compression may be executed by a user or by electronic control.

The secondary battery may be a lithium-ion secondary battery. The negative electrodes of the secondary battery may be carbon-based electrodes or silicon-based electrodes.

In the lithium-ion secondary battery in which the carbon-based electrodes or the silicon-based electrodes are adopted as the negative electrodes, the negative electrodes are easily expanded by increasing the SOC. With the above method, by expanding the negative electrodes, the positive electrodes can be compressed during the charging of the secondary battery. As such, in the recovery, distortion of the positive electrode is easily resolved.

In the recovery method, in the first compression, the positive electrodes may be compressed by increasing the SOC of the secondary battery until the negative electrodes are expanded.

With the above method, in the first compression, the positive electrodes can be easily compressed. Then, whether distortion occurs in the positive electrodes can be determined based on a change in resistance of the secondary battery while the positive electrodes are compressed.

The secondary battery may include a wound electrode body that includes the positive electrodes and the negative electrodes. The positive electrodes and the negative electrodes may be wound around a winding core while being alternately arranged with separators interposed therebetween. A longitudinal direction of the winding core may be perpendicular to a winding axis of the wound electrode body. The winding core may contain an elastic material and may be configured to extend in the longitudinal direction by a pressing force received from the wound electrode body.

In the secondary battery, the winding core extends in the longitudinal direction by the load applied from the outside, and the entire electrodes (more specifically, the wound electrode body wound around the winding core) are easily compressed. Therefore, distortion of the electrode is easily resolved by the load. With the above method, by resolving distortion of the electrode in the secondary battery, the increase in resistance due to distortion of the electrode is easily restricted.

The secondary battery may be a battery collected from an electrically driven vehicle. The electrically driven vehicle is configured to travel by using power stored in the battery.

Examples of the electrically driven vehicle include a fuel cell (FC) vehicle and a range extender vehicle (EV) in addition to an electric vehicle (EV), a hybrid vehicle (HV), and a plug-in hybrid vehicle (PHV).

With each aspect of the present disclosure, it is possible to accurately determine whether deterioration of recoverable performance of a secondary battery (more specifically, an increase in resistance of the secondary battery having a multilayer electrode structure due to distortion of an electrode) occurs, and execute a recovery process on the secondary battery, as needed.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
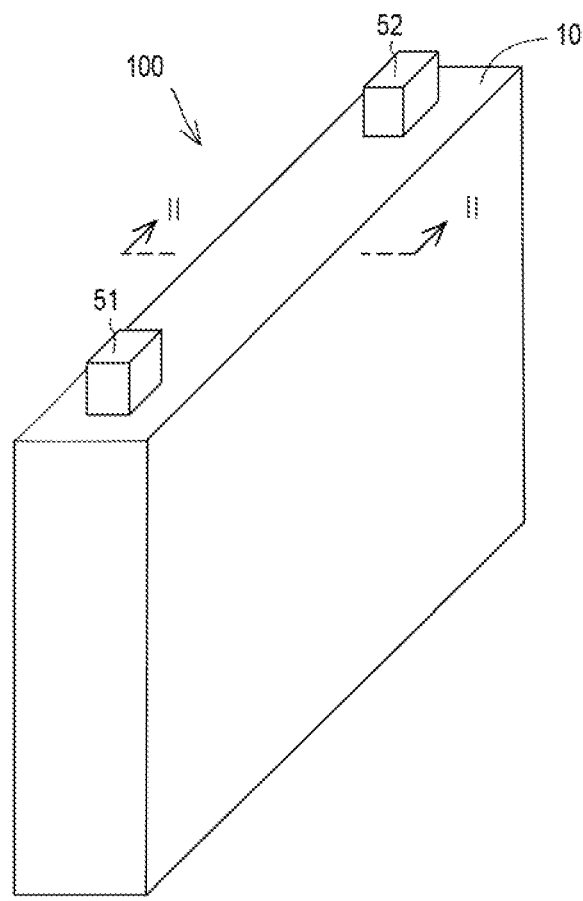
FIG. 1 is a diagram illustrating a schematic configuration of a secondary battery diagnosed by a diagnostic device for the secondary battery according to an embodiment of the present disclosure.

Embodiments of the present disclosure will be described in detail with reference to drawings. In the drawings, the like or corresponding parts are denoted by the like reference signs, and description thereof will not be repeated.

FIG. 1 is a diagram illustrating a schematic configuration of a secondary battery diagnosed by a diagnostic device for a secondary battery according to the present embodiment. With reference to FIG. 1, a secondary battery (hereinafter, simply referred to as a "battery") 100 includes a case 10, a positive electrode terminal 51, and a negative electrode terminal 52. In the present embodiment, the battery 100 is a liquid lithium-ion secondary battery that can be mounted on an electrically driven vehicle (for example, an EV, an HV, or a PHV). Moreover, the case 10 is a rectangular case formed of metal (for example, aluminum alloy). The case 10 may be provided with a gas discharge valve (not shown).

Figure 2:
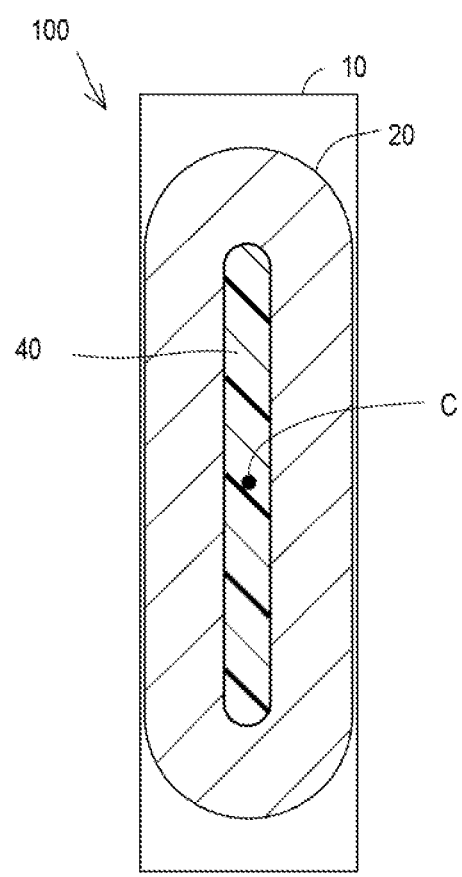
FIG. 2 is a diagram illustrating a cross-sectional view of II-II in FIG. 1.

FIG. 2 is a diagram illustrating a cross-sectional view of II-II in FIG. 1. With reference to FIG. 2, the case 10 accommodates a wound electrode body 20 and an electrolytic solution (not shown) that compose the lithium-ion secondary battery. The wound electrode body 20 is accommodated in the case 10 while being wound around a winding core 40. The winding core 40 has a flat shape. The cross section of the winding core 40 illustrated in FIG. 2 corresponds to a cross section of the winding core 40 that is perpendicular to a winding axis C of the wound electrode body 20. The winding core 40 has an elongated shape, and a longitudinal direction thereof is perpendicular to the winding axis C. The winding core 40 contains an elastic material and is configured to extend in the longitudinal direction by a pressing force received from the wound electrode body 20. As the elastic material, a rubber material can be adopted. In the present embodiment, as the elastic material forming the winding core 40, styrene-butadiene rubber is adopted.

Figure 3:
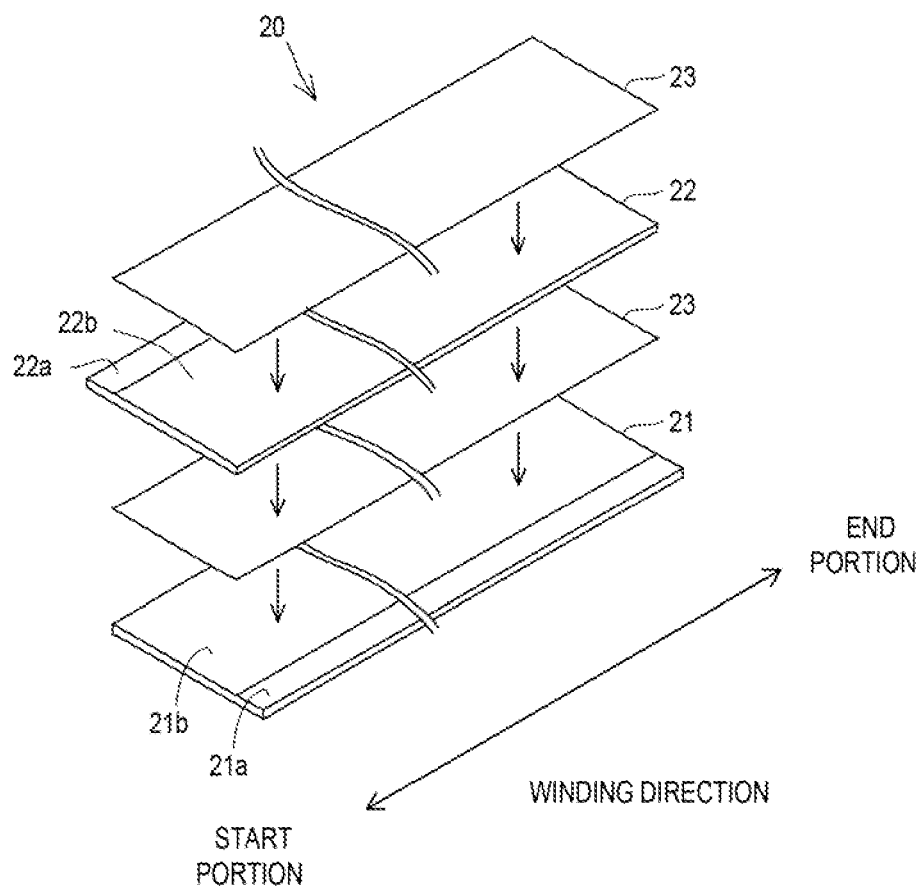
FIG. 3 is a diagram for describing a multilayer electrode structure of a wound electrode body illustrated in FIG. 2.

FIG. 3 is a diagram for describing a multilayer electrode structure of the wound electrode body 20. FIG. 3 illustrates the wound electrode body 20 before it is wound around the winding core 40. With reference to FIG. 3 together with FIGS. 1 and 2, the wound electrode body 20 is formed in a flat shape by winding strip-shaped electrode sheets around the winding core 40. More specifically, the wound electrode body 20 illustrated in FIG. 2 is formed by alternately laminating positive electrode sheets 21 and negative electrode sheets 22 with separators 23 interposed therebetween in the order of the positive electrode sheet 21, the separator 23, the negative electrode sheet 22, the separator 23, . . . , and then winding the laminated body obtained in the above manner around the winding core 40. The number of electrode sheets can be arbitrary.

In the wound electrode body 20, the positive electrode sheet 21 and the negative electrode sheet 22 function as a positive electrode and a negative electrode of the battery 100, respectively. In the present embodiment, positive electrodes and negative electrodes of the battery 100 are wound around the winding core 40 while being alternately arranged with the separators 23 interposed therebetween so as to form the wound electrode body 20. The battery 100 includes the wound electrode body 20 having a multilayer electrode structure (that is, a structure in which positive electrodes and negative electrodes are alternately arranged). In the wound electrode body 20, the separator 23 is interposed between the positive electrode sheet 21 and the negative electrode sheet 22. The separator 23 may be fixed at the end portion in the winding direction.

The positive electrode sheet 21 includes a positive electrode current collector 21a and a positive electrode active material layer 21b. The positive electrode active material layer 21b is formed on both surfaces of the positive electrode current collector 21a by coating, for example, a positive electrode mixture including a positive electrode active material on the surfaces of the positive electrode current collector 21a (for example, aluminum foil). An example of the positive electrode active material includes lithium transition metal oxides. In the present embodiment, as the positive electrode active material, a ternary positive electrode material of nickel-cobalt-manganese (NCM) is adopted. In other words, the positive electrodes of the battery 100 according to the present embodiment are ternary positive electrodes. The positive electrode active material layer 21b may include a conductive material (for example, acetylene black) and/or a binder (for example, polyvinylidene fluoride) in addition to the positive electrode active material.

The negative electrode sheet 22 includes a negative electrode current collector 22a and a negative electrode active material layer 22b. The negative electrode active material layer 22b is formed on both surfaces of the negative electrode current collector 22a by coating, for example, a negative electrode mixture including a negative electrode active material on the surfaces of the negative electrode current collector 22a (for example, copper foil). In the present embodiment, as the negative electrode active material, a carbon-based material (for example, graphite) is adopted. In other words, the negative electrodes of the battery 100 according to the present embodiment are carbon-based electrodes. The negative electrode active material layer 22b may include a thickener (for example, carboxymethyl cellulose) and/or a binder (for example, styrene-butadiene rubber) in addition to the negative electrode active material.

An example of the separator 23 includes a microporous film. The micropores in the separator 23 facilitate the retention of the electrolytic solution in the micropores. An example of a material of the separator 23 includes polyolefin resin, such as polyethylene (PE) or polypropylene (PP).

The above-described wound electrode body 20 is sealed in the case 10 together with the electrolytic solution. Then, the positive electrode current collector 21a is electrically connected to the positive electrode terminal 51 illustrated in FIG. 1, and the negative electrode current collector 22a is electrically connected to the negative electrode terminal 52 illustrated in FIG. 1. The electrolytic solution may include an aprotic solvent and a lithium salt (for example, $LiPF_6$) dissolved in the solvent. Examples of the aprotic solvent include ethylene carbonate (EC), ethylmethyl carbonate (EMC), dimethyl carbonate (DMC), and diethyl carbonate (DEC). Two or more types of solvents may be mixed and used.

Figure 4:
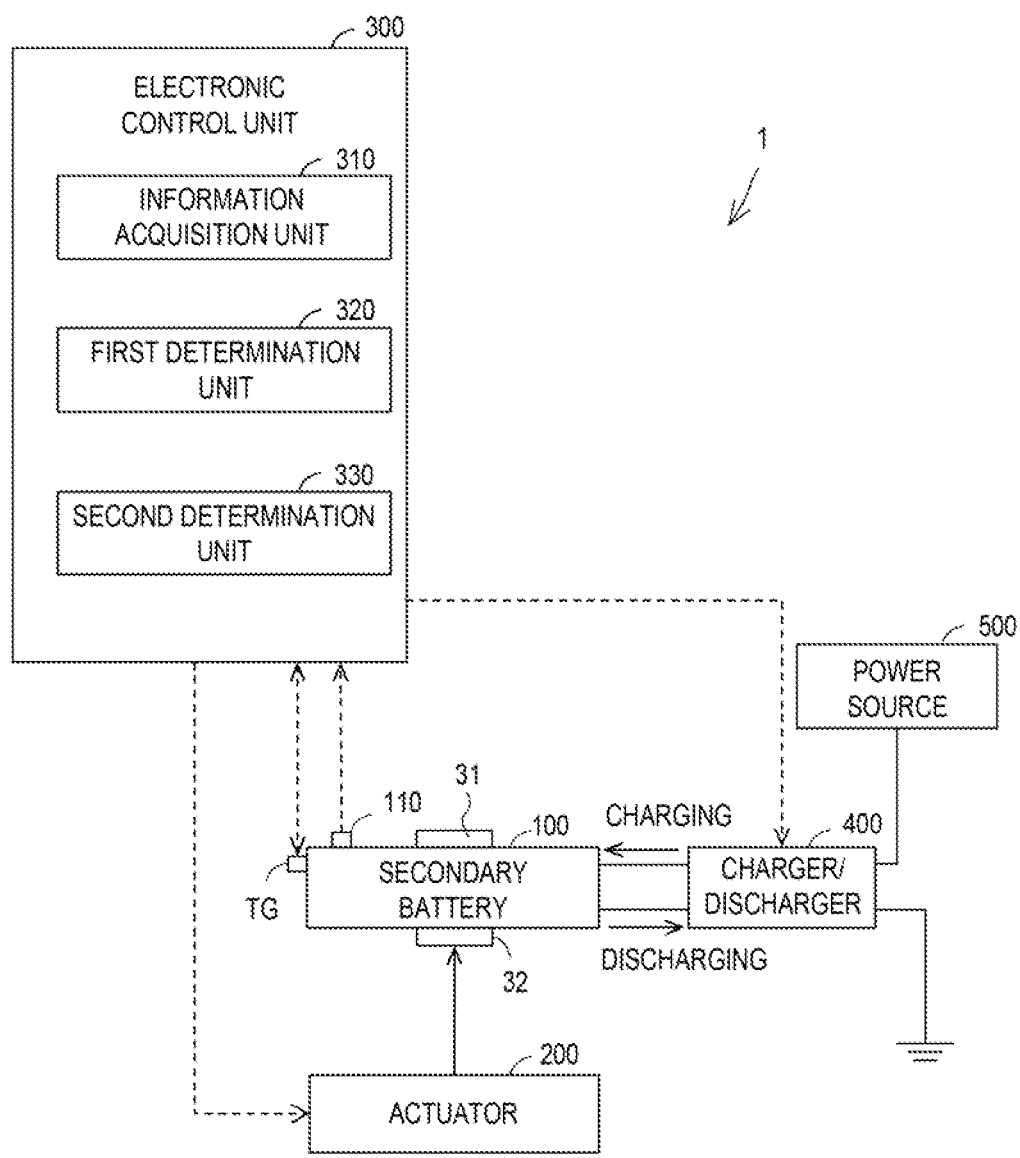
FIG. 4 is a diagram illustrating a configuration of the diagnostic device for the secondary battery according to the embodiment of the present disclosure.

FIG. 4 is a diagram illustrating a configuration of the diagnostic device for the secondary battery according to the present embodiment. With reference to FIG. 4, a diagnostic device 1 includes an electronic control unit 300, a charger/discharger 400, and a power source 500, and is configured to diagnose the above-described battery 100 (see FIGS. 1 to 3). A tag TG that stores information on the battery 100 is attached to the battery 100. The tag TG stores information indicating characteristics (for example, initial electrical resistance and capacity) of an initial state of the battery 100. The tag TG may also store information on a composition (for example, a material) of the battery 100. As the tag TG, for example, a radio frequency identification (RFID) tag can be adopted. The electronic control unit 300 is configured to read and rewrite the information stored in the tag TG by wireless or wired communication.

The battery 100 is further provided with a monitoring unit 110 that monitors a state of the battery 100. The monitoring unit 110 includes various sensors that detect the state (for example, the temperature, current, and voltage) of the battery 100 and outputs the detection result to the electronic control unit 300. The electronic control unit 300 can acquire the state (for example, the temperature, current, voltage, state-of-charge (SOC), and electrical resistance) of the battery 100 based on outputs (detection values of the various sensors) from the monitoring unit 110.

The battery 100 is electrically connected to the charger/discharger 400. The charger/discharger 400 is configured to charge and discharge the battery 100 according to an instruction from the electronic control unit 300. The charger/discharger 400 charges the battery 100 with power supplied from the power source 500. The charger/discharger 400 may convert power discharged from the battery 100 into heat using an electrical resistor (not shown), or may store the power in a predetermined power storage device (not shown).

Figure 5:
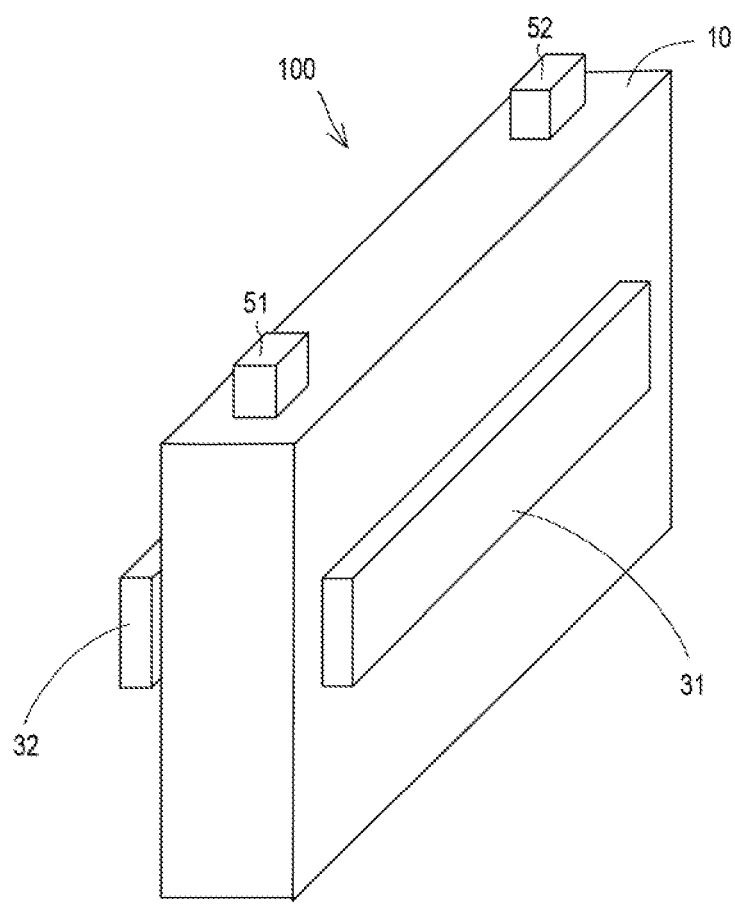
FIG. 5 is a diagram illustrating shapes and arrangements of constraint members illustrated in FIG. 4.

The battery 100 is provided with constraint members 31, 32. FIG. 5 is a diagram illustrating shapes and arrangements of the constraint members 31, 32. With reference to FIG. 5, the constraint members 31, 32 have elongated shapes and are arranged parallel to the winding axis C (see FIG. 2) of the wound electrode body 20. In the present embodiment, the constraint members 31, 32 are formed of a resin material (for example, polypropylene). The constraint members 31, 32 are arranged so as to face each other, with the battery 100 interposed therebetween. The constraint members 31, 32 are fixed on surfaces of the case 10 and restrict the case 10 from being deformed outward. However, the constraint members 31, 32 may be fixed by an arbitrary method, and the constraint members 31, 32 may be supported by an arm (not shown). Alternatively, the constraint member 31 and the constraint member 32 may be fastened to each other.

Returning to FIG. 4, the diagnostic device 1 further includes an actuator 200 that activates the constraint members 31, 32. The actuator 200 presses the constraint members 31, 32 against the battery 100 by activating the constraint members 31, 32, thereby applying a load to the battery 100. The battery 100 interposed between the constraint members 31, 32 is compressed by the load applied from the constraint members 31, 32. A magnitude of the load is controlled by the electronic control unit 300. The actuator 200 may be a hydraulic actuator. An example of a test device including the constraint members 31, 32 and the actuator 200 includes Autograph®.

Figure 6:
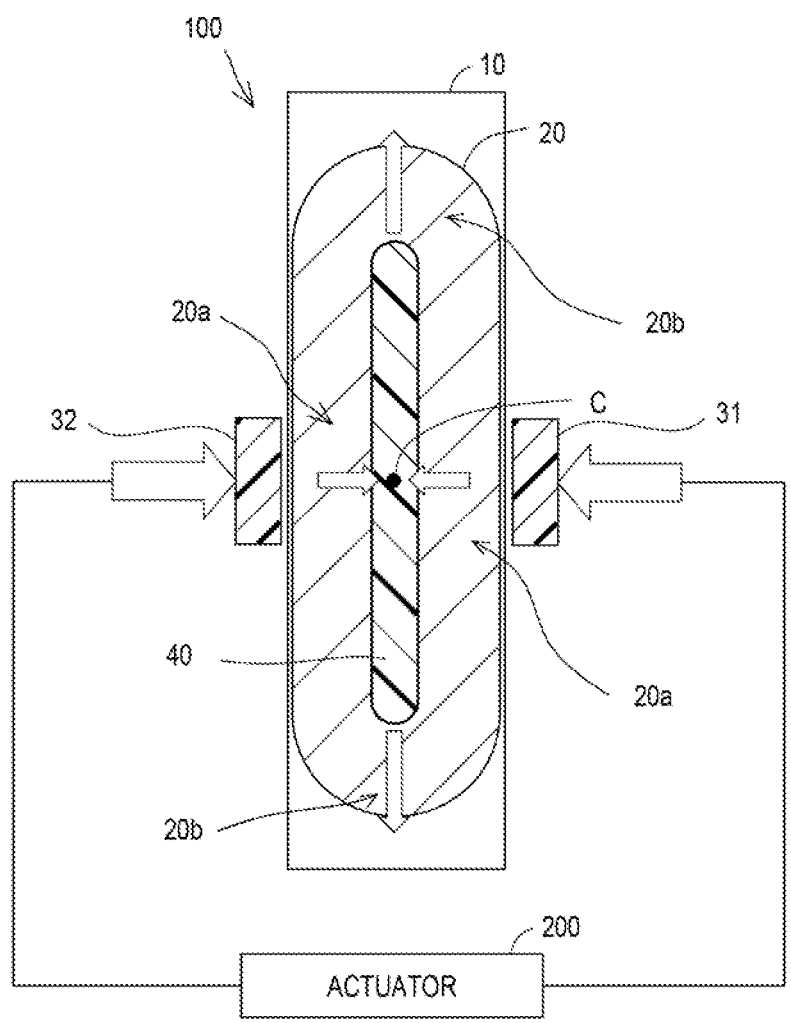
FIG. 6 is a diagram illustrating an example of a state of the secondary battery while compressed by the constraint members illustrated in FIG. 5.

FIG. 6 is a diagram illustrating an example of the state of the battery 100 while it is compressed. With reference to FIG. 6, when each of the constraint members 31, 32 activated by the actuator 200 applies a load to the battery 100, a flat part 20a of the wound electrode body 20 is compressed. Further, the winding core 40 is compressed by pressing the flat part 20a of the wound electrode body 20 inward. Since the winding core 40 contains an elastic material, the shape thereof is easily changed. The shape of the winding core 40 is changed so as to extend in the longitudinal direction by being pressed by the wound electrode body 20. As such, a curved part 20b of the wound electrode body 20 is also compressed.

Returning to FIG. 4, the electronic control unit 300 is configured to determine whether a resistance increase due to distortion of an electrode occurs in the battery 100. In more detail, when an electrode (for example, the positive electrode sheet 21 or the negative electrode sheet 22 illustrated in FIG. 3) composing the wound electrode body 20 of the battery 100 is distorted, a distance between the electrodes is increased or a contact point (or a contact area) of the electrode active material is decreased, and electrical resistance of the battery 100 tends to be increased due to a contact failure. The resistance increase in the battery 100 due to such distortion of the electrode is temporarily resolved by compressing the battery 100. In other words, the electrode becomes close to its original form due to compression. As distortion of the electrode is decreased, electrical resistance of the battery 100 is decreased. The electronic control unit 300 diagnoses the battery 100, using such a phenomenon. In other words, the electronic control unit 300 determines whether the resistance increase due to distortion of the electrode occurs in the battery 100 based on whether an amount of decrease in electrical resistance of the battery 100 is less than a predetermined amount when the battery 100 is compressed. Details of a configuration of the electronic control unit 300 will be described below.

As the electronic control unit 300, a microcomputer including a processor, a random access memory (RAM), and a storage device can be adopted. As the processor, for example, a central processing unit (CPU) can be adopted. The RAM functions as a working memory that temporarily stores data processed by the processor. The storage device is configured to maintain information stored therein. The number of processors included in the electronic control unit 300 is arbitrary, and may be one or plural.

The electronic control unit 300 includes an information acquisition unit 310, a first determination unit 320, and a second determination unit 330. In the electronic control unit 300, the information acquisition unit 310, the first determination unit 320, and the second determination unit 330 are embodied by, for example, the processor and a program executed by the processor. However, the present disclosure is not limited thereto, and each of these units may be embodied by dedicated hardware (an electronic circuit).

The information acquisition unit 310 is configured to acquire a first resistance value indicating a magnitude of electrical resistance of the battery 100 before the compression, compress the battery 100, and acquire a second resistance value indicating a magnitude of electrical resistance of the battery 100 after the compression. In the present embodiment, the information acquisition unit 310 is configured to compress the battery 100 by controlling the actuator 200 such that the actuator 200 applies a load to the battery 100 from the outside (the constraint members 31, 32). Hereinafter, the process in which the information acquisition unit 310 executes the compression is referred to as a "first compression process".

Using the first resistance value and the second resistance value acquired by the information acquisition unit 310, the first determination unit 320 is configured to determine whether the amount of decrease in electrical resistance of the battery 100 by the first compression process is less than the predetermined amount. Hereinafter, the case where the amount of decrease in electrical resistance of the battery 100 by the first compression process is less than the predetermined amount is referred to as "resistance decrease exists", and a case where the amount of decrease in electrical resistance of the battery 100 by the first compression process is not less than the predetermined amount is referred to as "no resistance decrease exists".

Using the determination result of the first determination unit 320, the second determination unit 330 determines whether the resistance increase due to distortion of the electrode occurs in the battery 100. More specifically, when the first determination unit 320 has determined that "resistance decrease exists", the second determination unit 330 recognizes that the resistance increase due to distortion of the electrode occurs in the battery 100 (hereinafter, also referred to as "distortion exists") and executes a predetermined process (hereinafter, also referred to as a "first diagnosis process"). On the other hand, when the first determination unit 320 has determined that "no resistance decrease exists", the second determination unit 330 recognizes that the resistance increase due to distortion of the electrode does not occur in the battery 100 (hereinafter, also referred to as "no distortion exists") and executes another predetermined process (hereinafter, also referred to as a "second diagnosis process").

Figure 7:
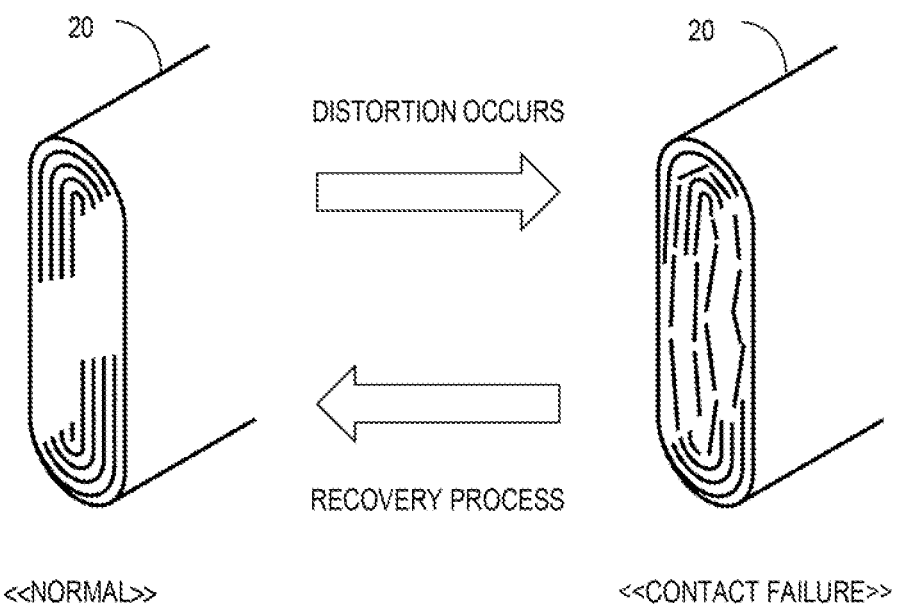
FIG. 7 is a diagram for describing a recovery process executed by a second determination unit illustrated in FIG. 4.

In the present embodiment, the second determination unit 330 executes, as the first diagnosis process, a predetermined recovery process and recording of a recovery history. FIG. 7 is a diagram for describing a recovery process executed by the second determination unit 330. With reference to FIG. 7 together with FIG. 4, when an electrode of the battery 100 is distorted and electrical resistance of the battery 100 is increased, the second determination unit 330 executes the recovery process. As such, distortion (and further, a contact failure) of the electrode is resolved, and the battery 100 becomes close to a normal state (that is, a state where no distortion occurs in the electrode). More specifically, the second determination unit 330 controls the actuator 200 such that the actuator 200 applies, to the battery 100, a load that compresses the battery 100. Hereinafter, the process in which the second determination unit 330 executes the compression (that is, a load is applied to the battery 100) is referred to as a "second compression process". By controlling the charger/discharger 400, the second determination unit 330 charges the battery 100 in a discharged state in which the SOC thereof has become equal to or less than the predetermined SOC value while a load is applied to the battery 100 by the second compression process. Hereinafter, the process for charging the battery 100 while the battery 100 is compressed by the second determination unit 330 is referred to as a "recovery process". In the present embodiment, the load in the second compression process becomes greater than the load in the first compression process. However, the present disclosure is not limited thereto, and the load in the first compression process may be the same as that in the second compression process.

When the first determination unit 320 has determined that "resistance decrease exists", the recovery process is executed, such that distortion of the electrode in the battery 100 is resolved. More specifically, in the present embodiment, carbon-based electrodes are adopted as the negative electrodes of the battery 100 and ternary-based positive electrodes are adopted as the positive electrodes of the battery 100. Therefore, the negative electrodes are expanded during the charging of the battery 100 and contracted during the discharging of the battery 100. The battery 100 according to the present embodiment is used, for example, while being mounted on an electrically driven vehicle (that is, the charging and the discharging are repeated), and thus distortion (more specifically, deformation causing a gap between the electrodes) of the positive electrode easily occurs. In the recovery process, distortion of the positive electrode which has occurred due to the use of the battery 100 can be accurately resolved. In the recovery process, the battery 100 is charged. As the battery 100 is charged, the negative electrodes of the battery 100 are expanded. Then, as the negative electrodes are expanded, the positive electrodes are compressed. As the battery 100 is charged while the battery 100 is compressed by the second compression process, the positive electrodes are tightly compressed and the distorted positive electrode easily returns to its original form. As the distorted positive electrode becomes close to its original form, contact resistance (and thus, electrical resistance of the battery 100) in the positive electrode is decreased.

On the other hand, when the first determination unit 320 has determined that "no resistance decrease exists", the second determination unit 330 executes the second diagnosis process. The second diagnosis process does not include the above-described recovery process. In the present embodiment, the second determination unit 330 records the diagnosis result (that is, no distortion exists) in the tag TG, as the second diagnosis process.

Figure 8:
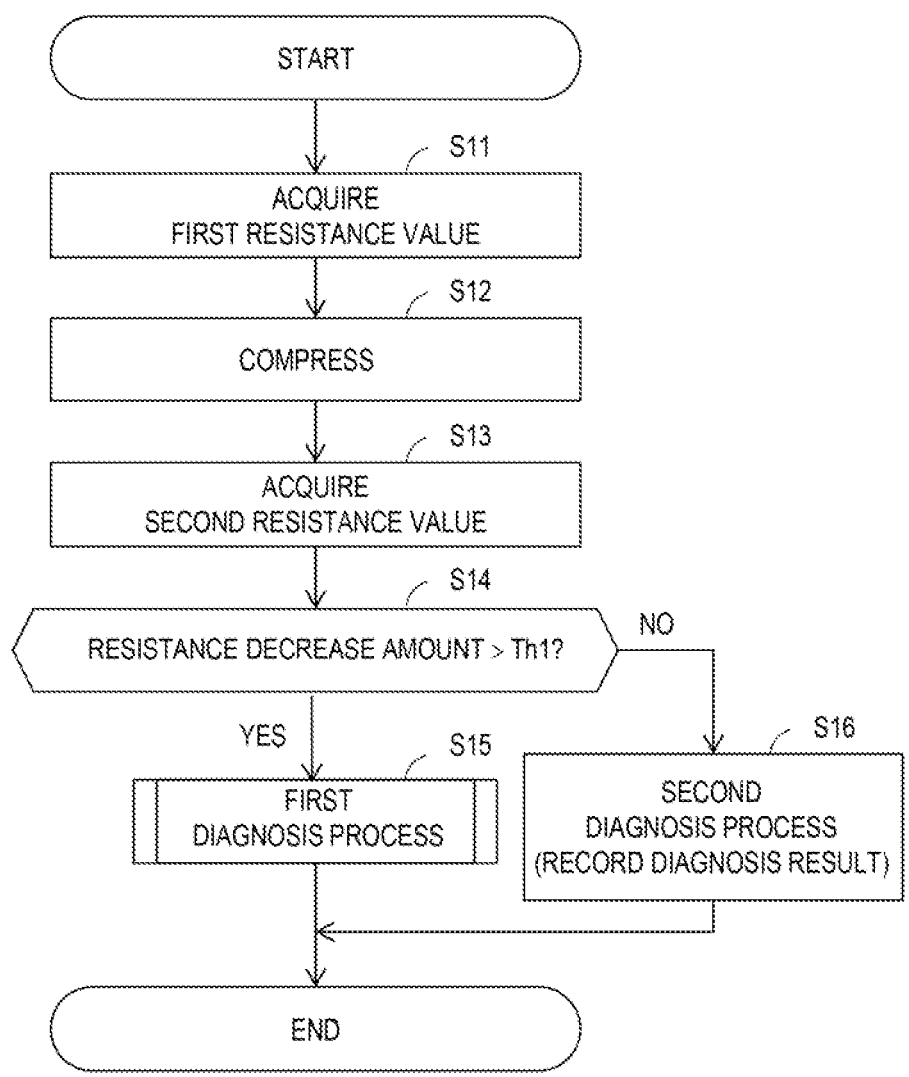
FIG. 8 is a flowchart illustrating a procedure of a diagnosis process executed by the diagnostic device for the secondary battery illustrated in FIG. 4.

FIG. 8 is a flowchart illustrating a procedure of a diagnosis process executed by the electronic control unit 300. A series of processes illustrated in the flowchart is started when, for example, a user instructs the electronic control unit 300 to start diagnosis in a state where the battery 100 is set in the diagnostic device 1. At the start of the process, a load (hereinafter, also referred to as a "constraint load") applied to the battery 100 by each of the constraint members 31, 32 is substantially zero. The battery 100 (that is, the secondary battery to be diagnosed) set in the diagnostic device 1 may be a battery collected from an electrically driven vehicle.

With reference to FIG. 8 together with FIG. 4, in step (hereinafter, simply represented by "S") 11, the information acquisition unit 310 acquires electrical resistance of the battery 100. The information acquisition unit 310 can acquire electrical resistance of the battery 100 using the voltage and the current during the discharging and the charging of the battery 100. The information acquisition unit 310 charges and discharges the battery 100 by controlling the charger/discharger 400. Further, the information acquisition unit 310 acquires the voltage and the current of the battery 100 from the monitoring unit 110. Electrical resistance of the battery 100 acquired in S11 corresponds to an example of the "first resistance value" according to the present disclosure. Any parameter indicating the magnitude of electrical resistance of the battery 100 can be adopted as the first resistance value, but in the present embodiment, a parameter represented by an equation, "R=(OCV−CCV)/I" is adopted. In the present embodiment, the information acquisition unit 310 acquires electrical resistance (R) by dividing a value, obtained by subtracting a closed-circuit voltage (CCV) from an open-circuit voltage (OCV), by a current (I).

In S12, the information acquisition unit 310 compresses the battery 100. S12 corresponds to an example of the "first compression process" according to the present disclosure. In other words, the information acquisition unit 310 compresses the battery 100 by controlling the actuator 200 such that the actuator 200 applies a load to the battery 100 from the outside (the constraint members 31, 32). The magnitude of the load in S12 can be arbitrarily set, and may be, for example, 3 kN or greater and 10 kN or less. In the present embodiment, the magnitude of the load in S12 is set to be 10 kN.

In S13, the information acquisition unit 310 acquires electrical resistance of the battery 100 while being compressed in the process of S12. Electrical resistance of the battery 100 acquired in S13 corresponds to an example of the "second resistance value" according to the present disclosure. The second resistance value is acquired in the same manner as the first resistance value. In other words, the information acquisition unit 310 calculates electrical resistance of the battery 100 according to the above-described equation, "R=(OCV−CCV)/I".

In S14, the first determination unit 320 determines whether the decrease amount of electrical resistance of the battery 100 by the first compression process (S12) is greater than a predetermined value. More specifically, when a value (hereinafter, also referred to as a "resistance decrease amount") obtained by subtracting the second resistance value (that is, electrical resistance of the battery 100 acquired in S13) from the first resistance value (that is, electrical resistance of the battery 100 acquired in S11) exceeds a predetermined threshold (hereinafter, also referred to as a "Th1"), the first determination unit 320 determines that a resistance decrease exists (YES in S14). On the other hand, when the resistance decrease amount (=first resistance value−second resistance value) is equal to or lower than Th1, the first determination unit 320 determines that no resistance decrease exists (NO in S14). Th1 can be arbitrarily set and may be set based on an initial electrical resistance (that is, electrical resistance of the battery 100 in the initial state). In the present embodiment, Th1 is set to be 10% of the initial electrical resistance. In other words, when the initial electrical resistance is 1Ω, Th1 is set to be 0.1Ω.

When the resistance increase due to distortion of the electrode occurs in the battery 100, distortion of the electrode is decreased by the first compression process (S12) and thus electrical resistance of the battery 100 is decreased. In other words, when the determination in S14 is negative, it means that the resistance increase due to distortion of the electrode does not occur in the battery 100. On the other hand, when the determination in S14 is positive, it means that the resistance increase due to distortion of the electrode occurs in the battery 100. Based on the result (YES/NO) of the determination (S14) by the first determination unit 320, the electronic control unit 300 according to the present embodiment can accurately determine whether the resistance increase due to distortion of the electrode occurs in the battery 100.

When the determination in S14 is negative, the second determination unit 330 executes the above-described second diagnosis process in S16. More specifically, the second determination unit 330 records, in the tag TG of the battery 100, information indicating that the resistance increase due to distortion of the electrode does not occur in the battery 100.

The second diagnosis process is not limited to the recording of the diagnosis result as above, and may be a notification of the diagnosis result. The method of notification is arbitrary, and the user may be notified by a display (for example, a display of characters or images) on a display device, by sound (including voice) through a speaker, or by turning on a predetermined lamp (including blinking). In addition, the second diagnosis process may include a process for transmitting the diagnosis result to a mobile terminal (for example, a tablet terminal, a smartphone, a wearable device, or a service tool) carried by the user.

Figure 9:
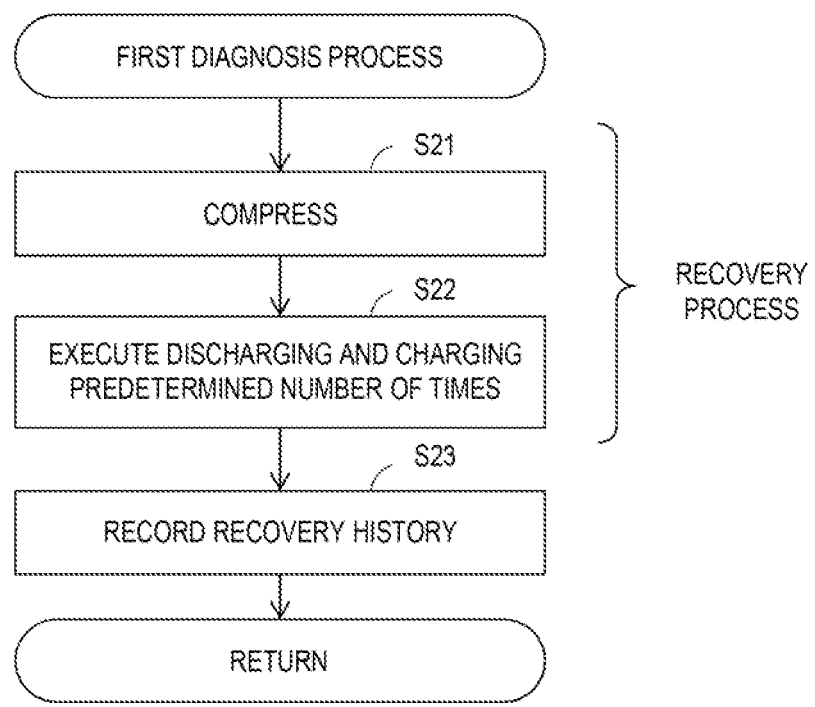
FIG. 9 is a flowchart illustrating details of a first diagnosis process (including the recovery process) illustrated in FIG. 8.

On the other hand, when the determination in S14 is positive (resistance decrease exists), the second determination unit 330 executes the above-described first diagnosis process (in the present embodiment, the recovery process and the recording of the recovery history) in S15. FIG. 9 is a flowchart illustrating details of the first diagnosis process (that is, a process executed when a resistance increase due to distortion of the electrode occurs in the secondary battery) executed in S15 in FIG. 8.

With reference to FIG. 9 together with FIG. 4, in S21, the second determination unit 330 compresses the battery 100. S21 corresponds to an example of the "second compression process" according to the present disclosure. In other words, the second determination unit 330 compresses the battery 100 by controlling the actuator 200 such that the actuator 200 applies a load to the battery 100 from the outside (the constraint members 31, 32). In the present embodiment, the load in S21 is greater than the load in S12. The magnitude of the load in S21 can be arbitrarily set, and may be, for example, 15 kN or greater and 50 kN or less. In the present embodiment, the magnitude of the load in S21 is set to be 20 kN.

In S22, the second determination unit 330 repeats the discharging and the charging of the battery 100 a predetermined number of times. The discharging and the charging in S22 are executed while the load is applied to the battery 100 by the second compression process (S21). The second determination unit 330 can discharge and charge the battery 100 by controlling the charger/discharger 400. S22 corresponds to an example of the "recovery process" according to the present disclosure. The number of times of the discharging and the charging in the recovery process can be arbitrarily set, and may be one or more and 50 or less. In the present embodiment, the number of times appropriate for resolving distortion, which is obtained in advance by experiments or simulation, is set to be a predetermined number of times. By the discharging, the SOC of the battery 100 becomes a predetermined first SOC value, and by the charging, the SOC of the battery 100 is changed from the first SOC value to a predetermined second SOC value. The first SOC value may be, for example, 0% or greater and 50% or less. The second SOC value is greater than the first SOC value, and may be, for example, 60% or greater and 100% or less. In the present embodiment, the first SOC value is set to be 0% and the second SOC value is set to be 100%. In S22, the charging is executed a predetermined number of times such that the SOC of the battery 100 is increased from 0% to 100%. A charging and discharging rate can be arbitrarily set, and may be, for example, 1 C.

By executing the process of S22, distortion of the electrode (for example, a positive electrode) of the battery 100 is resolved, and electrical resistance of the battery 100 is decreased. Then, in S23, the second determination unit 330 records, in the tag TG of the battery 100, the information indicating the history of the recovery process (for example, a date when the recovery process has been executed, a load in the second compression process, a SOC range in the recovery process, the number of times of discharging and charging, and a charging and discharging rate). By executing the process of S23, S15 in a main process (processes of FIG. 8) ends. Thereafter, S15 ends and the series of processes of FIG. 8 ends.

As described above, by executing the processes of S11 to S14 in FIG. 8, the electronic control unit 300 can accurately determine whether the resistance increase due to distortion of the electrode occurs in the battery 100. Moreover, with the electronic control unit 300, it is possible to execute the recovery process (S15 in FIG. 8) on the battery 100, as needed. Distortion of the electrode is resolved by the recovery process. As such, a state where deterioration of performance of the battery 100 is resolved (that is, the state where electrical resistance of the battery 100 is decreased) is basically maintained even if the compression is released.

In the above embodiment, in the first compression process (S12 in FIG. 8), the information acquisition unit 310 controls the actuator 200 such that the actuator 200 applies a load to the battery 100 from the outside. However, the present disclosure is not limited thereto, and the information acquisition unit 310 may be configured to compress the positive electrodes of the battery 100 by expanding negative electrodes of the battery 100. More specifically, in the first compression process (S12 in FIG. 8), the information acquisition unit 310 may control the charger/discharger 400 such that the SOC of the battery 100 is increased until the negative electrodes are expanded while the battery 100 is pressed by the constraint members 31, 32 (that is, a state where the thickness of the battery 100 is constant), thereby compressing the positive electrodes. With such a method, the positive electrodes of the battery 100 can be easily compressed in the first compression process. Alternatively, the negative electrodes of the battery 100 may be expanded by changing the temperature. For example, in the first compression process (S12 in FIG. 8), the temperature of the battery 100 may be increased until the negative electrodes of the battery 100 are expanded while the battery 100 is pressed by the constraint members 31, 32.

Figure 10:
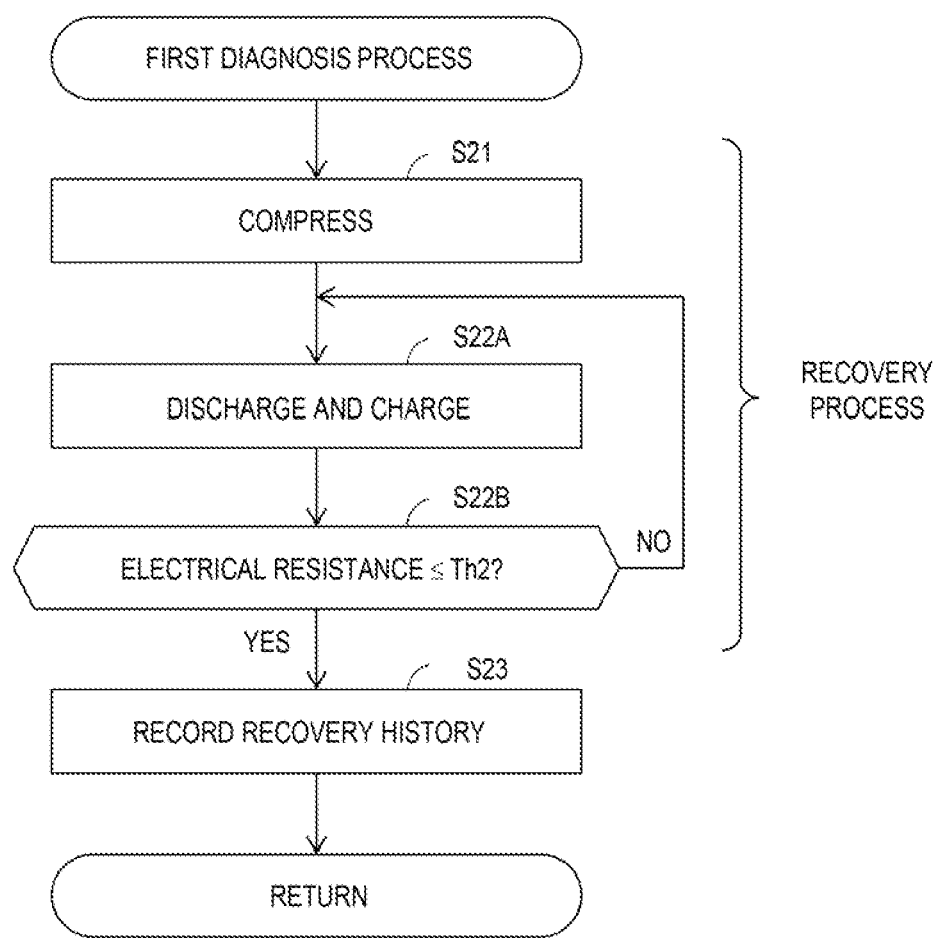
FIG. 10 is a flowchart illustrating a modified example of the first diagnosis process illustrated in FIG. 9.

In S15 in FIG. 8, a process illustrated in FIG. 10 may be executed instead of the process illustrated in FIG. 9. FIG. 10 is a flowchart illustrating a modified example of the process illustrated in FIG. 9. The process of FIG. 10 is the same as that of FIG. 9 except that S22A and S22B are adopted instead of S22 (see FIG. 9). Hereinafter, S22A and S22B will be described.

With reference to FIG. 10 together with FIG. 4, in S22A, the second determination unit 330 discharges the battery 100 such that the SOC thereof becomes the first SOC value (for example, 0%) and charges the battery 100 such that the SOC thereof is increased from the first SOC value to the second SOC (for example, 100%). Then, in S22B, the second determination unit 330 determines whether electrical resistance of the battery 100 is equal to or lower than a predetermined threshold (hereinafter, also referred to as "Th2"). Th2 can be arbitrarily set, and may be set based on electrical resistance of the battery 100 in the initial state. The processes of S22A and S22B are executed while the load is applied to the battery 100 by the second compression process (S21). When the determination in S22B is negative, the processes of S22A and S22B are repeated. Electrical resistance of the battery 100 tends to be decreased every time the process of S22A is executed. On the other hand, when the determination in S22B is positive (that is, electrical resistance is equal to or lower than Th2), the process proceeds to S23. When the determination in S22B is still negative even if the processes of S22A and S22B are executed more than a predetermined number of times, the process of FIG. 10 may be stopped due to a timeout.

According to the process illustrated in FIG. 10, while the load that compresses the battery 100 is applied to the battery 100, the discharging of the battery 100, which makes the SOC thereof become equal to or less than a predetermined SOC value, and the charging of the battery 100 in a discharged state in which the SOC thereof has become equal to or less than the predetermined SOC value are repeated until electrical resistance of the battery 100 becomes a value equal to or less than a predetermined value. As such, by repeating the discharging and the charging, electrical resistance of the battery 100 is sufficiently and easily decreased. In S22B, electrical resistance of the battery 100 may be measured while the compression by the second compression process (S21) is temporarily released and the battery 100 is not compressed.

In the above embodiment and the modified example, in S15 in FIG. 8, the battery 100 is discharged and charged while the load that compresses the battery 100 is applied to the battery 100. In order to verify the effect of such a recovery process, the inventors of the present disclosure prepared a positive electrode "NCM", a negative electrode "carbon", a separator "PP/PE/PP", and a winding-type lithium-ion secondary battery having a capacity of 25 Ah, and caused a resistance increase due to distortion of the electrode to occur in the lithium-ion secondary battery. As such, the capacity of the lithium-ion secondary battery was decreased by 30% of the initial state, and electrical resistance thereof was increased by 60% of the initial state. Then, a recovery process was executed on such a lithium-ion secondary battery under the following conditions.

Temperature: approximately 25° C.,
compression load: 20 kN,
SOC range: 0% to 100%,
charging and discharging rate: 1 C, time during which the recovery process is executed: 1 hour By executing the recovery process, the lithium-ion secondary battery recovered to a state where the capacity thereof is decreased by 20% of the initial state and electrical resistance thereof is decreased by 40% of the initial state. In other words, by executing the recovery process, distortion of the electrode could be resolved and the resistance increase due to distortion of the electrode could be restricted. Further, for comparison, instead of the recovery process, a process of leaving the battery 100 at 60° C. for 40 hours was executed. However, such a high-temperature process did not resolve the resistance increase due to distortion of the electrode.

The first diagnosis process does not have to include the recovery process. When the first determination unit 320 has determined that "resistance decrease exists", the second determination unit 330 may only record the diagnosis result as the first diagnosis process. In other words, when the diagnosis has ended, the second determination unit 330 may be configured to record the diagnosis result (distortion exists/no distortion exists) in the tag TG. Moreover, when the diagnosis has ended, the second determination unit 330 may be configured to notify a user of the diagnosis result in addition to or instead of recording the diagnosis result.

The battery 100 diagnosed and/or resolved by the process of FIG. 8 may be mounted on an electrically driven vehicle. The battery 100 may be mounted on an electrically driven vehicle while the load is applied to the battery 100 (that is, the battery 100 is constrained). The magnitude of the load applied to the battery 100 in the electrically driven vehicle may be determined based on the history of the recovery process stored in the tag TG of the battery 100.

Figure 11:
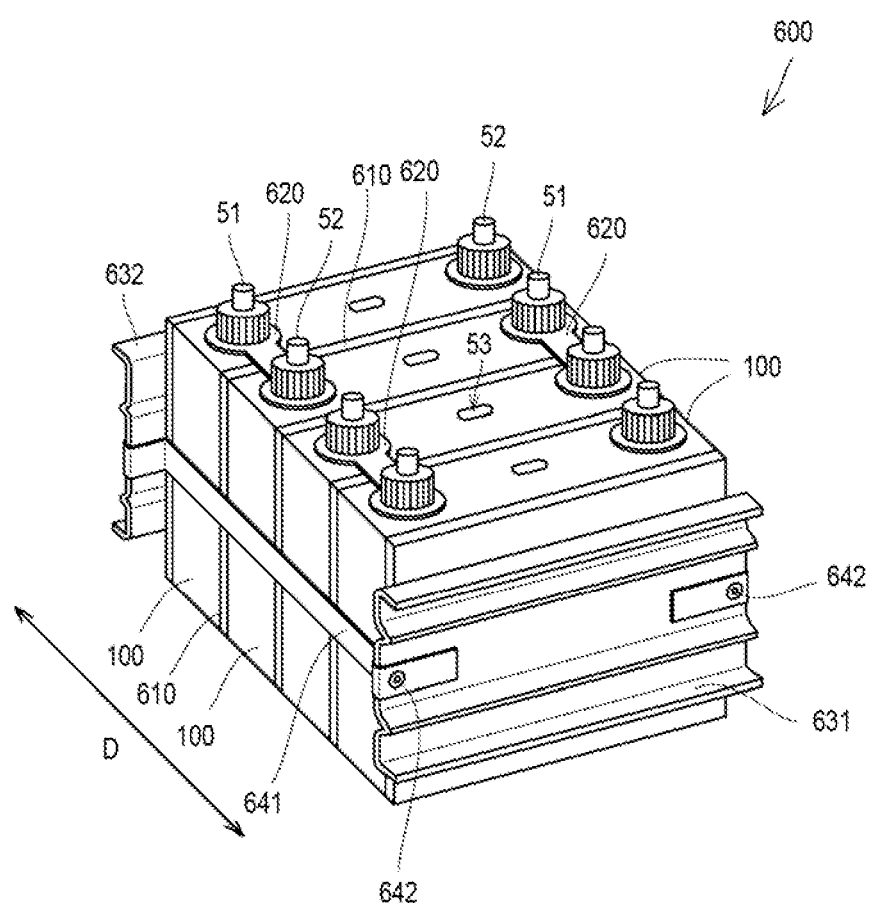
FIG. 11 is a diagram illustrating an example of an assembled battery that is manufactured using a plurality of secondary batteries diagnosed by the diagnostic device for the secondary battery according to the embodiment of the present disclosure.

An assembled battery may be manufactured using a plurality of batteries 100 diagnosed and/or resolved by the process of FIG. 8. Secondary batteries used for manufacturing the assembled battery may be selected based on the history of the recovery process stored in the tag TG. The assembled battery may be manufactured by collecting secondary batteries having similar magnitude of applied loads indicated in the history of the recovery process stored in the tag TG, and mounted on the electrically driven vehicle. FIG. 11 is a diagram illustrating an example of an assembled battery.

With reference to FIG. 11, an assembled battery 600 includes a plurality of batteries 100 and a plurality of spacers 610 which are alternately arranged. The spacers 610 are formed of, for example, a resin plate material. However, the shape and material of the spacer 610 are not limited thereto, and can be appropriately changed. Each of the batteries 100 may be, for example, a lithium-ion secondary battery on which the recovery process (S15 in FIG. 8) has been executed with the applied load having the magnitude similar to each other. Each of the batteries 100 includes a positive electrode terminal 51, a negative electrode terminal 52, and a gas discharge valve 53. The batteries 100 are electrically connected to one another in series. In more detail, each of the batteries 100 that compose the assembled battery 600 is arranged with their direction reversed one by one. Then, the positive electrode terminal 51 of one of the batteries 100 and the negative electrode terminal 52 of another adjacent one are electrically connected by a connecting member 620 (for example, a bus bar). Constraint plates 631, 632 are respectively arranged at both ends of the assembled battery 600 in the arranging direction D. Moreover, the constraint plate 631 and the constraint plate 632 are connected to each other via a constraint band 641. The constraint band 641 and the constraint plates 631, 632 are connected by screws 642. By tightening the screw 642, each of the batteries 100 can be compressed. Using the screws 642, the pressure (a constraint force) applied to the batteries 100 and the spacers 610 can be adjusted. The constraint force may be determined based on the history of the recovery process stored in the tag TG (see FIG. 4) of each battery 100.

In the above embodiment, the winding core 40 (see FIG. 6) contains an elastic material. However, the winding core 40 does not have to contain the elastic material. By forming the winding core 40 with a hard material, the flat part 20a is easily and tightly compressed.

In the above embodiment, carbon-based electrodes are adopted as the negative electrodes of the lithium-ion secondary battery. However, a material of the negative electrodes is not limited thereto, and can be appropriately changed. For example, the negative electrodes of the lithium-ion secondary battery may be silicon-based electrodes. Instead of a carbon-based material, a silicon-based material (for example, silicon, silicon alloy, or SiO) may be adopted. Further, a material of the positive electrodes can also be appropriately changed.

The secondary battery to be diagnosed is not limited to the liquid lithium-ion secondary battery, and may be another type of liquid secondary battery (for example, a nickel hydrogen secondary battery) or an all-solid-state secondary battery. The secondary battery to be diagnosed may be a multilayer flat plate type (stack type) secondary battery instead of the winding-type secondary battery. The secondary battery to be diagnosed is not limited to the secondary battery for vehicles, and may be a stationary secondary battery.

The embodiment disclosed herein needs to be considered as illustrative in all points and not restrictive. The scope of the present disclosure is shown not by the above description of the embodiments but by the claims, and is intended to include meanings equivalent to the claims and all modifications within the scope thereof.

What is claimed is:

1. A diagnostic device for a secondary battery having a structure in which positive electrodes and negative electrodes are alternately arranged, the diagnostic device comprising:
   an electronic control unit configured to:
      acquire a first resistance value indicating a magnitude of electrical resistance of the secondary battery before compression, and compress at least a part of the secondary battery;
      acquire a second resistance value indicating a magnitude of electrical resistance of the secondary battery after the compression;
      determine, using the first resistance value and the second resistance value, whether an amount of decrease in electrical resistance of the secondary battery by the compression is greater than a predetermined value; and
      determine whether an increase in electrical resistance due to distortion of at least one of the positive electrodes and the negative electrodes occurs in the secondary battery using a result of the determination on the amount of decrease in electrical resistance, wherein:
   the electronic control unit is configured to, upon determining that the increase in electrical resistance due to the distortion of at least one of the positive electrodes and the negative electrodes occurs in the secondary battery, execute a predetermined recovery process; and the predetermined recovery process includes charging, while a load that compresses the secondary battery is applied to the secondary battery, the secondary battery in a discharged state in which a state-of-charge (SOC) of the secondary battery has become equal to or less than a predetermined SOC value.

2. The diagnostic device according to claim 1, wherein the predetermined recovery process includes repeating, while the load that compresses the secondary battery is applied to the secondary battery, discharging the secondary battery such that the SOC of the secondary battery becomes equal to or less than the predetermined SOC value and charging the secondary battery in the discharged state in which the SOC of the secondary battery has become equal to or less than the predetermined SOC value, until electrical resistance of the secondary battery becomes equal to or less than a predetermined value.

3. The diagnostic device according to claim 1, wherein the electronic control unit is configured to compress the secondary battery by applying a load from an outside of the secondary battery.

4. The diagnostic device according to claim 1, wherein the electronic control unit is configured to compress the positive electrodes of the secondary battery by expanding the negative electrodes of the secondary battery.

* * * * *